United States Patent
Moyer et al.

(10) Patent No.: US 7,449,897 B2
(45) Date of Patent: *Nov. 11, 2008

(54) CURRENT FAULT DETECTION FOR LIGHT EMITTERS

(75) Inventors: Vincent C. Moyer, Milpitas, CA (US); Michael J. Brosnan, Fremont, CA (US); Shan Chong Tan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 11/833,057

(22) Filed: Aug. 2, 2007

(65) Prior Publication Data

US 2007/0268028 A1 Nov. 22, 2007

Related U.S. Application Data

(62) Division of application No. 11/178,686, filed on Jul. 11, 2005, now Pat. No. 7,271,601.

(51) Int. Cl.
 *G01R 27/08* (2006.01)
(52) U.S. Cl. ...................... 324/713; 324/767
(58) Field of Classification Search ............. 324/713, 324/767, 76.11
See application file for complete search history.

(56) References Cited

U.S. PATENT DOCUMENTS

| 4,884,280 | A | 11/1989 | Kinoshita |
| 6,704,183 | B2 | 3/2004 | Stafford |
| 6,836,157 | B2 | 12/2004 | Rader et al. |
| 2004/0201496 | A1* | 10/2004 | Hering et al. ............ 340/907 |
| 2005/0180473 | A1 | 8/2005 | Brosnan |

FOREIGN PATENT DOCUMENTS

JP  02082499  3/1990

OTHER PUBLICATIONS

Search Report for Patent Application in Great Britain No. 06130660.0 dated Sep. 28, 2006.

* cited by examiner

*Primary Examiner*—Vincent Q Nguyen

(57) ABSTRACT

A device includes a light emitter, a current sensing resistance, a current generator, and detection circuitry. The current generator is connected to the light emitter and to the current sensing resistance. During a normal operating mode of the device, the current generator regulates current flow through the light emitter. In a test mode, the current generator regulates current flow through the current sensing resistance. The detection circuitry, during the test mode, detects when current flow through the current sensing resistance is outside an expected range.

3 Claims, 3 Drawing Sheets

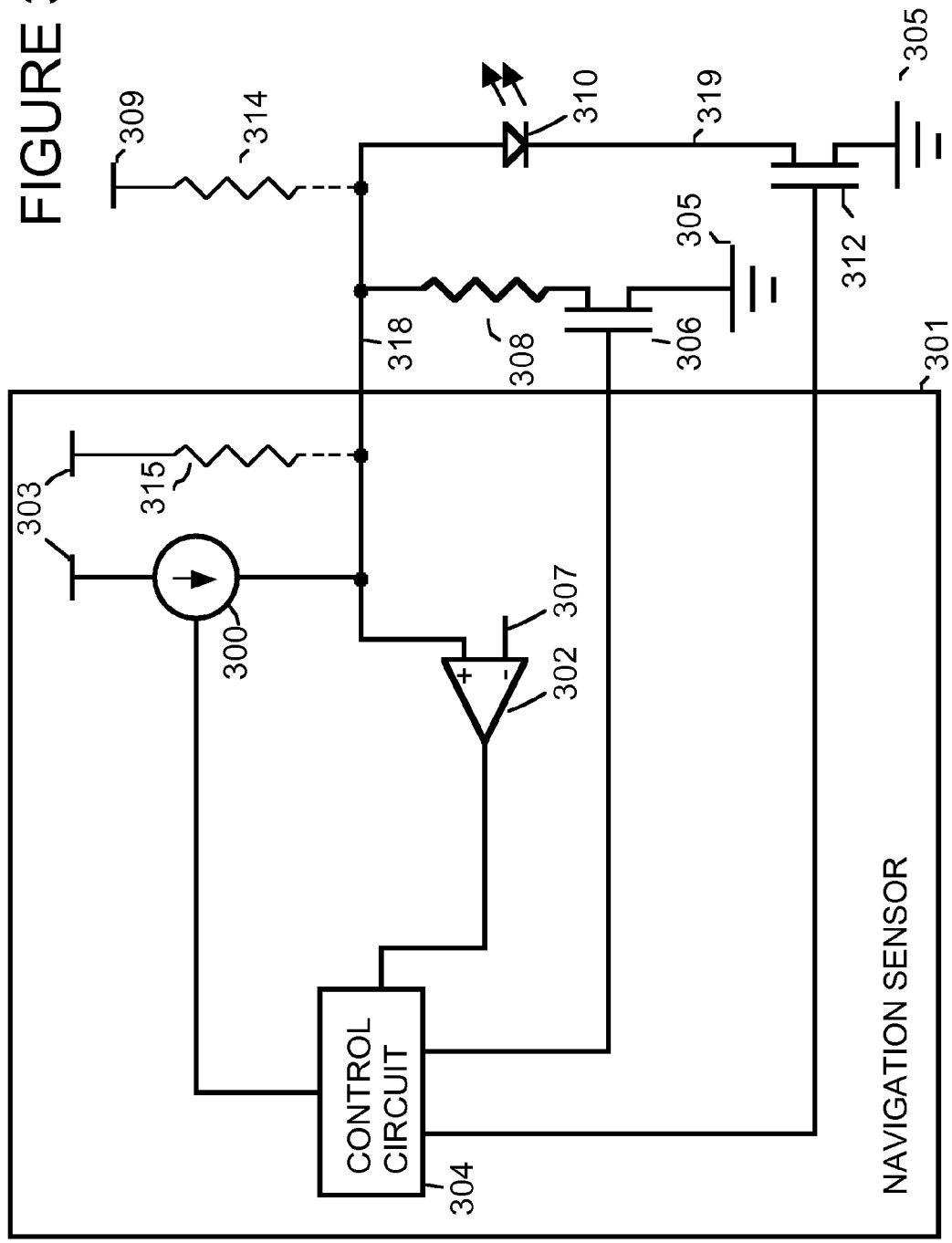

CURRENT FAULT DETECTION FOR LIGHT EMITTERS

CROSS-REFERENCE TO RELATED APPLICATION

This is a Divisional of application Ser. No. 11/178,686, filed on Jul. 11, 2005 now U.S. Pat. No. 7,271,601, the entire disclosure of which is incorporated herein by reference.

BACKGROUND

Products containing light emitting diodes (LEDs) or lasers that emit light in the visible or infrared range are required to conform to eye safety requirements in the International Electrotechnical Commission (IEC) standard 60825-1. If the optical flux that can impinge on a user's eye exceeds the standard set out in IEC 60825-1, the device must be labeled an eye safety hazard. This requirement applies not only during normal operation of the circuit, but also when predictable single faults occur in the circuit.

Fuses can be used in a safety circuit for lasers. When the bias current to a laser light emitter exceeds the eye safety requirement, the fuse blows. Alternatively, a retriggerable transistor circuit can be used that shunts current away from a laser light emitter when the current exceeds a design threshold.

Alternatively, a monitoring photodiode having an output indicative of the actual output of the laser can be used. For example, a comparator compares a reference signal indicative of a reference output level of a laser and a monitor photodiode signal. The comparator output signal reflects the change in the actual optical output level of the laser. An abnormal current eliminator controls the comparator output so that the signal has limited amplitude. Hence, the drive current to the laser is forcibly decreased to safe drive current levels. See U.S. Pat. No. 4,884,280 issued to Kinoshita for "Semiconductor Laser Driving Device for Stabilizing the Optical Output Thereof".

SUMMARY OF THE INVENTION

In accordance with an embodiment of the present invention, a device includes a light emitter, a current sensing resistance, a current generator, and detection circuitry. The current generator is connected to the light emitter and to the current sensing resistance. During a normal operating mode of the device, the current generator regulates current flow through the light emitter. In a test mode, the current generator regulates current flow through the current sensing resistance. The detection circuitry, during the test mode, detects when current flow through the current sensing resistance is outside an expected range.

BRIEF DESCRIPTION OF THE DRAWINGS

FIG. 3 shows another implementation of light emitter current fault detection in accordance with another embodiment of the present invention.

DESCRIPTION OF THE EMBODIMENT

Figure 1:
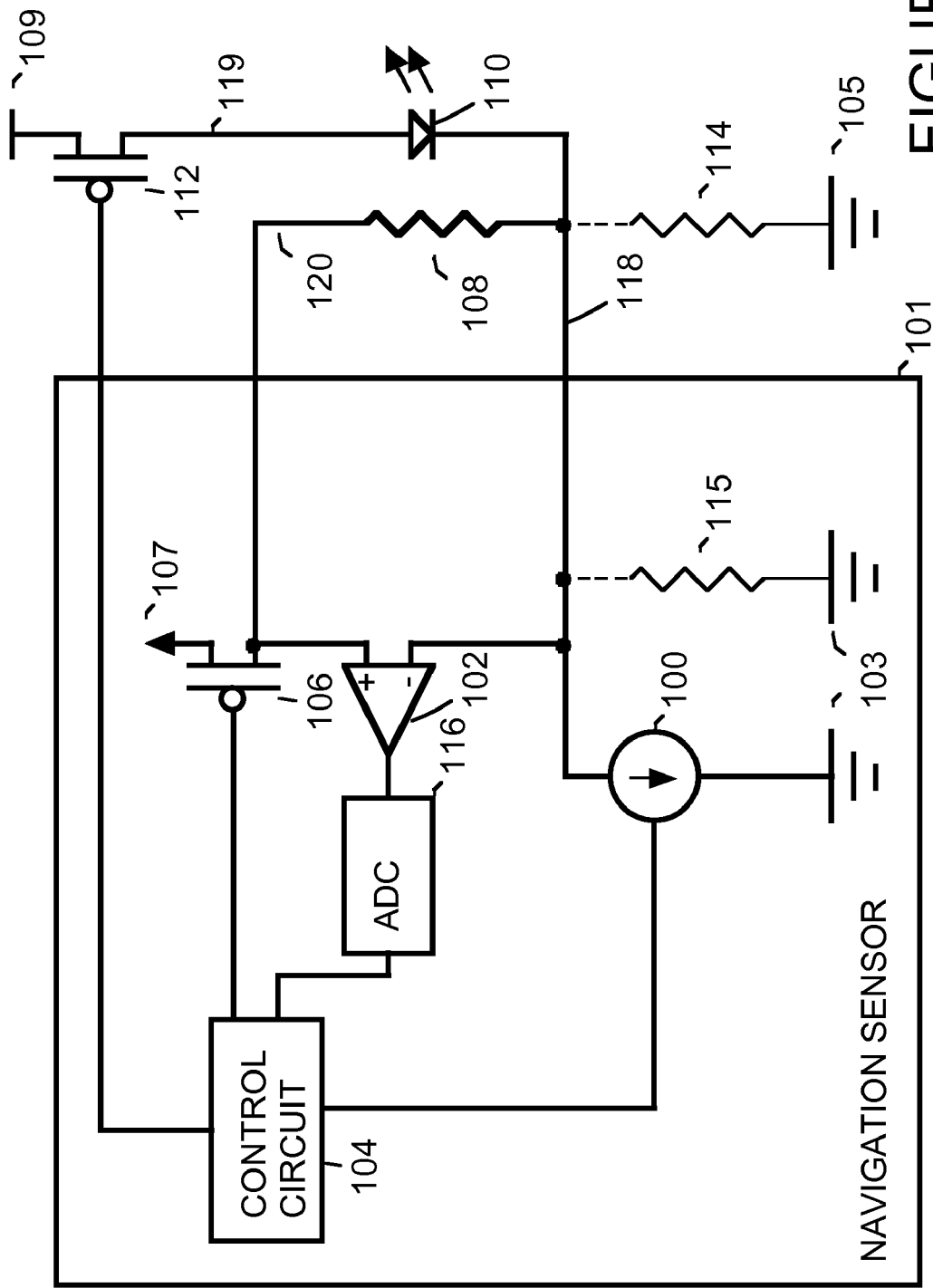
FIG. 1 shows an implementation of light emitter current fault detection in accordance with an embodiment of the present invention.

FIG. 1 is a simplified block diagram showing circuitry within a navigation sensor circuit 101 used to drive a light emitter 110. For example, navigation sensor circuit 101 is a navigation circuit such as those found on an optical mouse or other optical devices used for detection of motion. For example, navigation sensor circuit 101 is implemented as an integrated circuit. For example, light emitter 110 is implemented as a light emitting diode (LED), as a vertical-cavity surface emitting laser (VCSEL) or some other device that emits light.

Within navigation sensor 101, a programmable current source 100 regulates the current through light emitter 110 when a switch 112 is on. Current source 100 is connected, for example to a ground voltage 103 internal to navigation sensor 101. For example, switch 112 is implemented using a field effect transistor (FET).

A resistor 108 is a current sensing resistor used for detection of faults such as leakage resistance. A voltage value at a node 118 is dependent on a supply voltage (VCC) 109 and a forward voltage drop (V_110) across light emitter 110. The voltage drop across switch 112 is assumed to be negligible.

For example, a typical voltage value for supply voltage 109 is 2.8 volts (V). A typical voltage value at node 118 is 0.4 V. This means a typical forward voltage drop (V_110) is equal to 2.4V. It is noted that in common circuit design, current source 100 requires that voltage at node 118 be above some minimum voltage for proper operation.

A control circuit 104 periodically performs fault detection. For example, fault detection is performed during each frame in which navigation sensor circuit 101 is used to capture an image illumined by light emitter 110. In order to perform fault detection, control circuit 104 turns off FET 112. Turning off FET 112 disconnects power supply 109 from light emitter 110 causing the current through light emitter 110 to become substantially zero. Control circuit 104 turns on an FET 106 to connect a reference voltage 107 to sense resistor 108. For example, reference voltage 107 can be VCC or be set at another regulated voltage value. Control circuit 104 turns on an FET 106 to connect a reference voltage 107 to sense resistor 108. For example, reference voltage 107 can be set at VCC or at another voltage value intermediate between VCC and the voltage at node 118. Control circuit 104 also sets current source 100 to a predetermined value. Substantially all the current flowing through current source 100 flows through resistor 108, causing a voltage drop (V_108) across resistor 108. The voltage drop (V_108) across resistor 108 is equal to the current (I_108) flowing in resistor 108 multiplied by the resistance value (R_108) of resistor 108 (i.e., V_108=I_108 * R_108).

The voltage drop (V_108) across resistor 108 is converted to a digital value by a differential amplifier 102 and an analog to digital converter (ADC) 116. A set of predetermined settings for current source 100 and expected digital values from ADC 116 are stored in control circuit 104. If the digital values match the expected range, then control circuit 104 resumes normal operation of navigation sensor 101 by turning off FET 106 and turning on FET 112, and restoring current source 100 to the operating current value. The configuration of differential amplifier 102 is exemplary. For example, differential amplifier 102 can be implemented as a single-ended amplifier connected to node 118 with reference to ground. Alternatively, differential amplifier 102 can be omitted and ADC 116 be connected directly to node 118

Leakage can occur, for example when a spurious connection is made between node 118 and ground voltage 103 internal to navigation sensor 101, or between node 118 and a ground voltage 105 external to navigation sensor 101. A spurious connection between node 118 and ground voltage 103 is represented by a leakage resistance 115. A spurious connection between node 118 and ground voltage 105 is represented by a leakage resistance 114.

If leakage resistance 114 and/or leakage resistance 115 is present, the current flowing in leakage resistance 114 and/or leakage resistance 115 adds to the total current in resistor 108. This increased current increases the voltage drop (V_108) across resistor 108.

The source of leakage resistance 114 could be, for example, a short circuit on the printed circuit board, for example due to a solder ball or cut off component lead not removed during assembly, or due to another cause. Leakage resistance 114 could also be resistive, for example, due to contamination, for example, from a spilled soft drink, or from another cause. The resistance can be very small or have a resistance of hundreds or even thousands of ohms.

The source of leakage resistance 115 could be, for example, a circuitry defect or other damage to the integrated circuitry of navigation sensor 101.

During normal operation (e.g., a normal operating mode), current flowing through leakage resistance 114 and/or leakage resistance 115 (if either of these are present) adds to the total current flowing through light emitter 110. This increases the optical power output of light emitter 110, possibly exceeding the eye safety limit specified for the product.

Other types of fault that may be detected include the failure of FET 112 to turn off, and a spurious connection between VCC 109 and a node 119. Neither of these faults will cause the light emitter power to increase during normal operation; however, these faults do represent a potential safety hazard due to the loss of light source control by FET 112 in the event leakage resistance 114 or leakage resistance 115 is present. During the fault test cycle, these faults will decrease the current through resistor 108 because some portion of the current flowing in current source 100 will flow through light emitter 110. The decreased current I_108 will cause lower than expected voltage V_108.

If, during a fault detection cycle (e.g., a test mode), the increased voltage across current sensing resistor 108 due to leakage resistance 114 or leakage resistance 115, or the decreased voltage across current sensing resistor 108 due to failure of FET 112 or spurious connection to node 119, causes digital values from ADC 116 to exceed the expected range, a fault is detected. In this event control circuit 104 responds to the fault detection. For example, upon detecting a fault, control circuit 104 holds FET 112 off and turns current source 100 off so that light emitter 110 remains off. Additionally, a user readable indicator fault flag can be set.

While resistor 108 can be located internal to navigation sensor 101, it is currently advantageous, when navigation sensor is implemented as an integrated circuit, to place resistor 108 external to the integrated circuitry. When resistor 108 is located external to the integrated circuitry, a low tolerance resistor, for example +/−1% of the nominal value, may be economically used. This compares to a typical tolerance of +/−20% for commonly available CMOS semiconductor processes. The low tolerance of resistor 108 enables more precise measurement of leakage resistance 114 and leakage resistance 115, thereby allowing economic fault detection before the eye safety power is exceeded. The value of resistor 108 is selected to achieve this goal.

Because sense resistor 108 is not in series with light emitter 110, no additional voltage drop is introduced to node 118 during normal operation.

Other types of faults will also be detected during the fault detection cycle. For example, a fault in current source 100 that leads to increased light emitter output power should be detected during the fault detection cycle. During the fault increased current through current source 100 will result in higher digital values from ADC 116. When the digital values from ADC 116 exceed the expected range, a fault is detected.

Other errors resulting, for example, in reduction of voltage at node 118 are also detectable. For example, when a reduction of voltage at node 118 causes a reduction in current generated by current source 100 so that the voltage values detected by ADC 116 during fault detection are outside the expected range, a fault is detected.

Instead of using an ADC to monitor voltage drop range, other circuitry, for example, one or more comparators, can be used to provide values to a control circuit.

Figure 2:
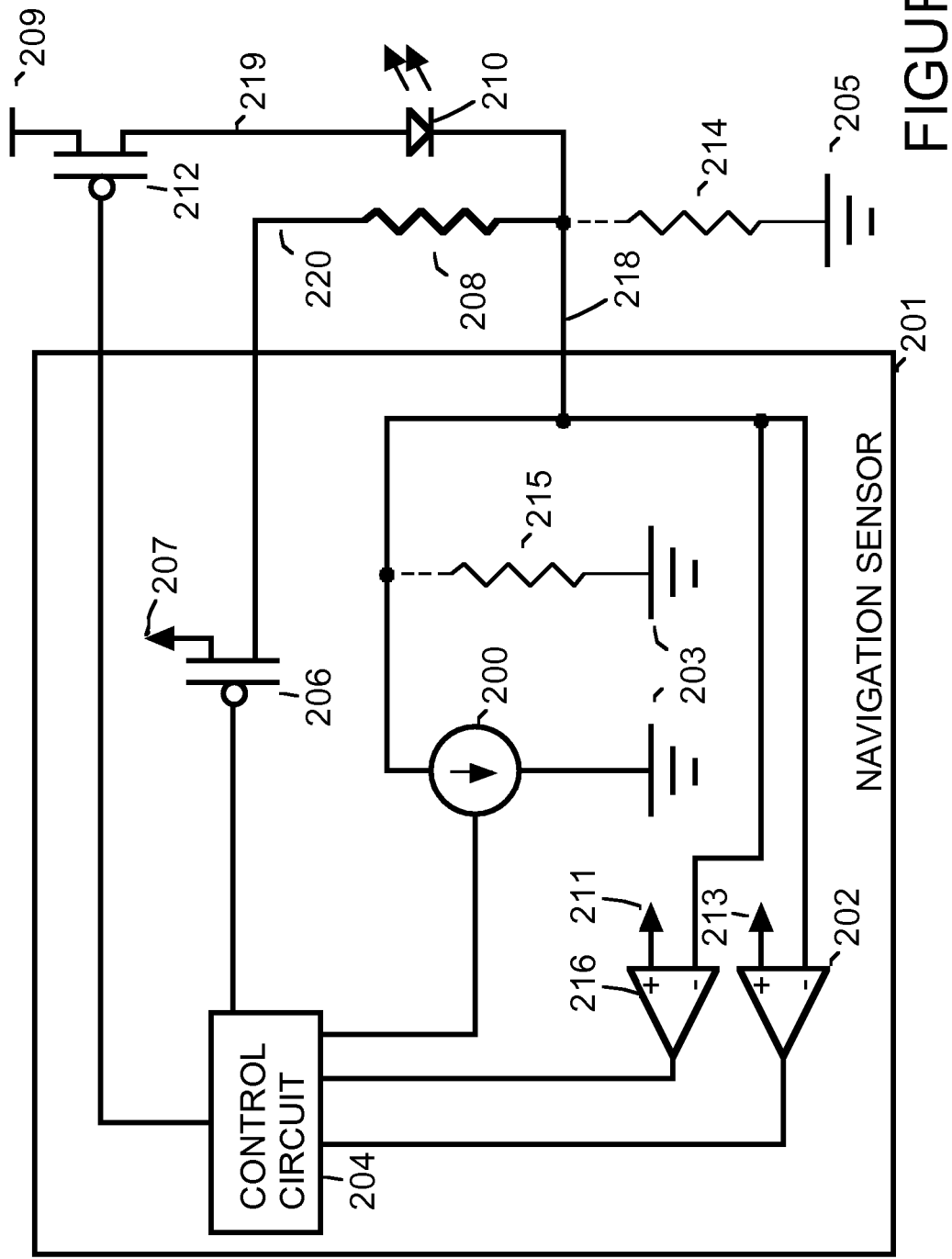
FIG. 2 shows another implementation of light emitter current fault detection in accordance with another embodiment of the present invention.

For example, FIG. 2 is a simplified block diagram showing circuitry within a navigation sensor circuit 201 used to drive a light emitter 210. For example, navigation sensor circuit 201 is a navigation circuit such as those found in an optical mouse or other optical devices used for detection of motion. For example, navigation sensor circuit 201 is implemented as an integrated circuit. For example, light emitter 210 is implemented as a light emitting diode (LED), as a vertical-cavity surface emitting laser (VCSEL) or as some other device that emits light.

Within navigation sensor 201, a programmable current source 200 sets the current through light emitter 210 when a switch 212 is on. Current source 200 is connected, for example, to a ground voltage 203 internal to navigation sensor 201. For example, switch 212 is implemented using a Field Effect Transistor (FET).

A resistor 208 is a current sensing resistor used for detection of faults such as leakage resistance. A voltage value at node a 218 is dependent on a supply voltage (VCC) 209 and a forward voltage drop (V_210) across light emitter 210. The voltage drop across switch 212 is assumed to be negligible.

A control circuit 204 periodically performs fault detection. For example, fault detection is performed during each frame in which navigation sensor circuit 201 is used to capture an image illumined by light emitter 210. In order to perform fault detection, control circuit 204 turns off FET 212. Turning off FET 212 disconnects power supply 209 from light emitter 210 causing the current through light emitter 210 to become substantially zero. Control circuit 204 turns on an FET 206 to connect a first reference voltage 207 to sense resistor 208. Control circuit 204 also sets current source 200 to a predetermined value. Substantially all the current flowing through current source 200 flows through resistor 208, causing a voltage drop (V_208) across resistor 208. The voltage drop (V_208) across resistor 208 is equal to the current (I_208) flowing in resistor 208 multiplied by the resistance value (R_208) of resistor 208 (i.e., V_208=I_208 * R_208).

A set of predetermined settings for current source 200 is stored by control circuit 204. For each setting, a comparator compares the voltage at node 218 with an expected voltage. A different comparator value is checked for each expected voltage. If the voltage at node 218 is below the expected voltage, a leakage current (or another fault) is indicated and a fault is detected.

For example, FIG. 2 shows two comparators: a comparator 216 and a comparator 202. This allows two expected voltages (and thus two settings for current source 200) to be tested. Comparator 216 compares the voltage at node 218 with a reference voltage 211. Comparator 202 compares the voltage at node 218 with a reference voltage 213. If it is desired to test additional settings for current source 200, additional comparators can be added. Alternatively, a single comparator can be used and control circuit 204 can change a voltage value for the reference input of the comparator for each setting of current source 200.

As discussed above, leakage can occur, for example when a spurious connection is made between node 218 and ground voltage 203 internal to navigation sensor 201, or between node 218 and a ground voltage 205 external to navigation sensor 201. A spurious connection between node 218 and ground voltage 203 is represented by a leakage resistance 215. A spurious connection between node 218 and ground voltage 205 is represented by a leakage resistance 214.

If leakage resistance 214 and/or leakage resistance 215 is present, the current flowing in leakage resistance 214 and/or leakage resistance 215 adds to the total current in resistor 208 which increases the voltage drop (V_208) across resistor 208 and thus lowers the voltage present at node 218.

Other types of faults that may be detected include the failure of FET 212 to turn off, and a spurious connection between VCC 209 and node 219. Neither of these faults will cause the light emitter power to increase during normal operation; however, these faults do represent a potential safety hazard due to the loss of light source control by FET 212 in the event leakage resistance 214 or leakage resistance 215 is present.

A control circuit 204 periodically performs fault detection. For example, fault detection is performed during each frame in which navigation sensor circuit 201 is used to capture an image illumined by light emitter 210. In order to perform fault detection, control circuit 204 turns off FET 212. Turning off FET 212 disconnects power supply 209 from light emitter 210 causing the current through light emitter 210 to become substantially zero. Control circuit 204 also sets current source 200 to a predetermined value and continues to hold FET 206 off. Under this condition the voltage at node 218 is set by the known characteristics of current source 200 and is expected to be low, for example 0.1V. If FET 212 fails to turn off, or if a spurious connection between VCC 209 and a node 219 exists, the voltage at node 218 will be higher than expected.

Other errors resulting for example, in reduction of voltage at node 218 voltage are also detectable, as described above.

The principles of the present invention also apply when detecting leakage to a power supply (VCC). For example, FIG. 3 is a simplified block diagram showing circuitry within a navigation sensor circuit 301 used to drive a light emitter 310. For example, navigation sensor circuit 301 is a navigation circuit such as those found in an optical mouse or other optical devices used for detection of motion. For example, navigation sensor circuit 301 is implemented as an integrated circuit. For example, light emitter 310 is implemented as a light emitting diode (LED), as a vertical-cavity surface emitting laser (VCSEL) or some other device that emits light.

Within navigation sensor 301, a programmable current source 300 regulates the current through light emitter 310 when a switch 312 is on. Current source 300 is connected, for example to a power supply (VCC) 303 internal to navigation sensor 301. For example, switch 312 is implemented using a field effect transistor (FET).

A resistor 308 is a current sensing resistor used for detection of faults such as leakage resistance. A voltage value at a node 318 is dependent on a ground voltage 305 and a forward voltage drop (V_310) across light emitter 310. The voltage drop across switch 312 is assumed to be negligible.

For example, a typical voltage value for supply voltage 303 is 2.8 volts (V). A typical voltage value at node 318 is 2.4 V. This means a typical forward voltage drop (V_310) is equal to 2.4V. It is noted that in common circuit design, current source 300 requires that voltage at node 318 be some minimum voltage below VCC for proper operation.

A control circuit 304 periodically performs fault detection. For example, fault detection is performed during each frame in which navigation sensor circuit 301 is used to capture an image illumined by light emitter 310. In order to perform fault detection, control circuit 304 turns off FET 312. Turning off FET 312 disconnects ground voltage 305 from light emitter 310 causing the current through light emitter 310 to become substantially zero. Control circuit 304 turns on an FET 306 to connect ground voltage 305 to sense resistor 308. Control circuit 304 also sets current source 300 to a predetermined value. Substantially all the current flowing through current source 300 flows through resistor 308, causing a voltage drop (V_308) across resistor 308. The voltage drop (V_308) across resistor 308 is equal to the current (I_308) flowing in resistor 308 multiplied by the resistance value (R_308) of resistor 308 (i.e., V_308=I_308 * R_308).

A set of predetermined settings for current source 300 and reference voltage 307 is stored by control circuit 304. For each setting, a comparator 302 compares the voltage at node 318 with an expected reference voltage 307. Alternatively, additional comparators may be used, each with a unique preset reference voltage.

If no fault is detected by the comparator(s), then control circuit 304 resumes normal operation of navigation sensor 301 by turning off FET 306 and turning on FET 312, and restoring current source 300 to the operating current value. The configuration of comparator 302 is exemplary.

Leakage can occur, for example when a spurious connection is made between node 318 and supply voltage 303 internal to navigation sensor 301, or between node 318 and a supply voltage 309 external to navigation sensor 301. A spurious connection between node 318 and supply voltage 303 is represented by a leakage resistance 315. A spurious connection between node 318 and supply voltage 309 is represented by a leakage resistance 314.

If leakage resistance 314 and/or leakage resistance 315 is present, the current flowing in leakage resistance 314 and/or leakage resistance 315 adds to the total current in resistor 308. This increased current increases the voltage at node 318.

The source of leakage resistance 314 could be, for example, a short circuit on the printed circuit board, for example due to a solder ball or cut off component lead not removed during assembly, or due to another cause. Leakage resistance 314 could also be resistive, for example, due to contamination, for example, from a spilled soft drink, or from another cause. The resistance can be very small or have a resistance of hundreds or even thousands of ohms.

The source of leakage resistance 315 could be, for example, a circuitry defect or other damage to the integrated circuitry of navigation sensor 301.

During normal operation (e.g., a normal operating mode), current flowing through leakage resistance 314 and/or leakage resistance 315 (if either of these are present) adds to the total current flowing through light emitter 310. This increases the optical power output of light emitter 310, possibly exceeding the eye safety limit specified for the product.

If, during a fault detection cycle (e.g., a test mode), the increased voltage at node 318 exceeds the expected reference voltage 307, a fault is detected. In this event control circuit 304 responds to the fault detection. For example, upon detecting a fault, control circuit 304 holds FET 312 off and turns current source 300 off so that light emitter 310 remains off. Additionally, a user readable indicator fault flag can be set.

While resistor 308 can be located internal to navigation sensor 301, it is currently advantageous, when navigation sensor is implemented as an integrated circuit, to place resistor 308 external to the integrated circuitry. When resistor 308 is located external to the integrated circuitry, a low tolerance resistor, for example +/−1% of the nominal value, may be economically used. This compares to a typical tolerance of +/−20% for commonly available CMOS semiconductor processes. The low tolerance of resistor 308 enables more precise measurement of leakage resistance 314 and leakage resistance 315, thereby allowing economic fault detection before the eye safety power is exceeded. The value of resistor 308 is selected to achieve this goal.

Because sense resistor 308 is not in series with light emitter 310, no additional voltage increase is introduced to node 318 during normal operation.

In another embodiment, comparator 302 is replaced by an amplifier and ADC to convert the voltage drop across sense resistor 308 to a digital value. Control circuit 304 has an expected range of digital values stored for each setting of current source 300. If a digital value exceeds the expected range during a test cycle, a fault is detected.

Other types of faults that may be detected include the failure of FET 312 to turn off, and a spurious connection between ground voltage and node 319. Neither of these faults will cause the light emitter power to increase during normal operation; however, these faults do represent a potential safety hazard due to the loss of light source control by FET 312 in the event leakage resistance 314 or leakage resistance 315 is present.

A control circuit 304 periodically performs fault detection. For example, fault detection is performed during each frame in which navigation sensor circuit 301 is used to capture an image illumined by light emitter 310. In order to perform fault detection, control circuit 304 turns off FET 312. Turning off FET 312 disconnects ground voltage 305 from light emitter 310 causing the current through light emitter 310 to become substantially zero. Control circuit 304 also sets current source 300 to a predetermined value and continues to hold FET 306 off. Under this condition the voltage at node 318 is set by the known characteristics of current source 300 and is expected to be high, for example 2.7V. If FET 312 fails to turn off, or if a spurious connection between ground voltage and node 319 exists, the voltage at node 318 will be lower than expected.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for controlling a light emitter comprising the following:
   during a normal operating mode, regulating current flow through a light emitter using a current generator;
   during a test mode; performing the following:
      regulating current flow through a current sensing resistance using the current generator,
      detecting when current flow through the current sensing resistance is outside an expected range; and
   controlling a switch between a first voltage and the light emitter so that during the normal operating mode, the light emitter is electrically connected to the first voltage, and so that during the test mode, the light emitter is electrically disconnected from the first voltage.

2. A method for controlling a light emitter comprising the following:
   during a normal operating mode, regulating current flow through a light emitter using a current generator;
   during a test mode; performing the following:
      regulating current flow through a current sensing resistance using the current generator,
      detecting when current flow through the current sensing resistance is outside an expected range; and
   controlling a switch between a first voltage and the current sensing resistance so that during the test mode, the current sensing resistance is electrically connected to the first voltage, and so that during the normal operating mode, the current sensing resistance is electrically disconnected from the first voltage.

3. A method for controlling a light emitter comprising the following:
   during a normal operating mode, regulating current flow through a light emitter using a current generator;
   during a test mode; performing the following:
      regulating current flow through a current sensing resistance using the current generator,
      detecting when current flow through the current sensing resistance is outside an expected range; and
   controlling a first switch between a first voltage and the light emitter so that during the normal operating mode, the light emitter is electrically connected to the first voltage, and so that during the test mode, the light emitter is electrically disconnected from the first voltage; and,
   controlling a second switch between a second voltage and the current sensing resistance so that during the test mode, the current sensing resistance is electrically connected to the second voltage, and so that during the normal operating mode, the current sensing resistance is electrically disconnected from the second voltage.

* * * * *